(12) United States Patent
Badano et al.

(10) Patent No.: US 11,152,406 B2
(45) Date of Patent: Oct. 19, 2021

(54) MATRIX OF PHOTODETECTORS WITH PERIPHERAL ABSORPTION PROVIDED WITH FOCUSSING STRUCTURES

(71) Applicant: Commissariat A L'Energie Atomique et aux Energies Alternatives, Paris (FR)

(72) Inventors: Giacomo Badano, Grenoble (FR); Clément Lobre, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/693,432

(22) Filed: Nov. 25, 2019

(65) Prior Publication Data

US 2020/0176494 A1 Jun. 4, 2020

(30) Foreign Application Priority Data

Dec. 3, 2018 (FR) ...................................... 1872252

(51) Int. Cl.
*H01L 27/146* (2006.01)
(52) U.S. Cl.
CPC .. *H01L 27/14607* (2013.01); *H01L 27/14629* (2013.01); *H01L 27/14645* (2013.01)
(58) Field of Classification Search
CPC ................................................ H01L 27/14607
See application file for complete search history.

(56) References Cited

U.S. PATENT DOCUMENTS

| | | |
|---|---|---|
| 2012/0273907 A1 | 11/2012 | Lim |
| 2013/0003204 A1 | 1/2013 | Cheng et al. |
| 2013/0135502 A1 | 5/2013 | Hiramoto et al. |

FOREIGN PATENT DOCUMENTS

FR  2 983 352 B1  1/2016

OTHER PUBLICATIONS

U.S. Appl. No. 16/477,359, filed Jul. 11, 2019, Badano, G, et al.
French Preliminary Search Report dated Sep. 18, 2019 in French Application 18 72252 filed on Dec. 3, 2018 (with English Translation of Categories of Cited Documents).
Schaake, H. F, et al., "High Operating Temperature MWIR detectors", Proceedings of SPIE, vol. 7608, Jan. 2010, 14 pages.

*Primary Examiner* — Grant S Withers
(74) *Attorney, Agent, or Firm* — Oblon, McClelland, Maier & Neustadt, L.L.P.

(57) ABSTRACT

A photodetection device including a pixel matrix, each of the pixels including a photodiode, the absorption region of which extends entirely or almost entirely inside a volume surrounding a central region of the pixel; and a focusing element. An assembly of focusing elements is composed of refractive structures, each formed by a first truncated pyramid with a recess in the shape of a second inverted pyramid. The angles $\varphi_i$ at the base of the pyramids satisfy the following relation:

$$2 * \varphi_i - \sin^{-1}\left(\frac{n_0}{n_1}\sin(\varphi_i)\right) < \frac{\pi}{2}$$

wherein $n_0$ is the optical index of a medium surrounding the refractive structures on the side opposite the photodiodes, and $n_1$ is an optical index of the refractive structures.

16 Claims, 4 Drawing Sheets

MATRIX OF PHOTODETECTORS WITH PERIPHERAL ABSORPTION PROVIDED WITH FOCUSSING STRUCTURES

TECHNICAL FIELD

The invention relates to the field of detection and/or measurement of electromagnetic radiation. It is more particularly related to a photodetection device comprising a pixel matrix, in which each pixel comprises a photodiode. An absorption region of each photodiode extends entirely, or almost entirely, inside a volume surrounding a central region of a pixel.

STATE OF PRIOR ART

Photodiode matrices are known in prior art in which the absorption region of each photodiode extends entirely, or almost entirely, within a volume surrounding a central region of the pixel. For example, this volume may be in the form of an open torus (cylindrical tube curved back onto itself). This type of geometry limits cross-talk, in other words detection by a photodiode of a carrier generated by absorption of a photon in a neighbouring photodiode. Such a photodiode matrix conventionally comprises an active layer made of a semiconducting material, within which doped zones extend, each of which defines a PN junction. Therefore each doped zone corresponds to one photodiode. Each of the doped zones extends across the entire thickness or almost the entire thickness of the active layer. The absorption region in each photodiode then extends entirely or almost entirely in a volume in the form of a torus surrounding the doped zone. It is recalled that the absorption region of a photodiode designates the region made of a semiconducting material in which incident photons generate electron-hole pairs that cause the emission of an electric current in the photodiode.

An example of such a photodiode matrix is described by Schaake H. F. & al., in the paper entitled "*High Operating Temperature MWIR detectors*", Proceedings of SPIE, Vol. 7608, January 2010. This paper contains a description of photodiodes said to be vertically integrated, with a through hole or via, that passes through the active layer from one side to the other, passing through the centre of the doped zone. In this case, the absorption region extends entirely within a volume laterally surrounding the via.

Another example of such a photodiode matrix is described in patent FR 2 983 352. This patent describes photodiodes formed in an active layer made of a semiconducting material, each having a P-doped central zone surrounded by a N-doped absorption region, itself surrounded by a strongly N-doped separation region. The doped zone may extend across the entire thickness of the active layer. In this case, the absorption region extends entirely within a volume laterally surrounding the doped zone. As a variant, the doped zone does not extend across the entire thickness of the active layer. In this case, the absorption region extends almost entirely within a volume open at the centre laterally surrounding the doped zone, and also passes underneath the doped zone.

One purpose of this invention is to improve the sensitivity of a photodetection device comprising a pixel matrix, in which each pixel comprises one photodiode. An absorption region of each photodiode extends entirely or mostly within a volume surrounding a central region of said pixel.

PRESENTATION OF THE INVENTION

This purpose is achieved with a photodetection device comprising a pixel matrix, each pixel containing one photodiode. An absorption region of each photodiode extends entirely or mostly within a volume surrounding a central region of the pixel.

According to the invention, each pixel also comprises a focussing element, to focus light radiation arriving at an approximately normal incidence on the pixel, on an absorption region of the photodiode belonging to said pixel.

The focussing elements are composed of an assembly of refractive structures. Each refractive structure is formed by a first truncated pyramid and is provided with a recess. The base of said first pyramid is parallel to the plane of the pixel matrix, and is located on the side of the refractive structure facing the photodiodes. The recess is in the form of a second complete or truncated pyramid. The base of said second pyramid extends parallel to the plane of the pixel matrix, on the side of the refractive structure opposite the photodiodes.

Furthermore, each of the angles $\varphi_i$ at the base of the first pyramids and the second pyramids satisfies the following relation:

[Math 1]

$$2\varphi_i - \sin^{-1}\left(\frac{n_0}{n_1}\sin(\varphi_i)\right) < \frac{\pi}{2} \quad (1)$$

in which $n_0$ is the optical index of a medium surrounding the refractive structures on the side opposite the photodiodes, and $n_1$ is an optical index of said refractive structures.

Throughout this text, light radiation arriving at a pixel at an approximately normal incidence is oriented along an axis inclined at an angle of less than or equal 7° relative to the normal to the plane of the pixel matrix.

The absorption region of each of the photodiodes of the device according to the invention extends entirely or mostly in a volume laterally surrounding a central region of the pixel. In other words, in each pixel, more than half or even more than 80% of the volume of the absorption region extends within said volume laterally surrounding a central region of the pixel. In other words again, the absorption region of each of the photodiodes extends principally in a peripheral zone of the pixel. Two examples of photodiodes with this characteristic are described in the introduction, although the invention is not limited to these examples.

The focussing elements can also be called "photon collection elements". They are capable of deviating light radiation arriving at the pixel matrix at an approximately normal incidence towards the absorption regions of each of the photodiodes.

The assembly of focussing elements is composed of refractive structures. Each of the refractive structures has a shape defined by a first truncated pyramid in which there is a recess in the shape of a second complete or truncated pyramid. Therefore the shape of the focussing elements is defined by a series of plane faces, which facilitates fabrication. The particular distinction of focussing elements is that they are in the form of microlenses that have curved faces that are more difficult to make.

Each of the angles at the base of the first pyramids (and of the second pyramids) designates an angle formed between the base of said pyramid and a corresponding lateral face of the same pyramid. It can be shown that when the condition in equation (1) is satisfied, the energy of a light beam arriving at an approximately normal incidence on the pixel matrix can be concentrated under the refractive structure, in a volume laterally surrounding a central region of the pixel matrix. Once again, light radiation arriving on the pixel matrix or at a pixel at an approximately normal incidence is a beam oriented along an axis inclined at an angle from the normal to the plane of the pixel matrix of less than or equal 7°. Throughout this text, a light beam arriving on the pixel matrix on the side of the focussing elements is also considered. It is thus possible to concentrate the energy of such a light beam within volumes that coincide with absorption regions of photodiodes. Regardless of its incidence position on the pixel, light radiation arriving at an approximately normal incidence on said pixel is then deviated towards the absorption region of the same pixel, where it can give rise to charge carriers capable of generating a current. In particular, light radiation arriving on the pixel facing a central region of said pixel is deviated to the periphery of the pixel, at the location of the absorption region. Thus, although said central region is occupied by elements that that prevent the detection of photons (for example via or doped zone), all photons on the pixel matrix can be detected. The capture efficiency of the photodiodes, and therefore the sensitivity of the device according to the invention, is thus improved. The capture efficiency refers to the ratio of the number of charges passing through the PN junction to the number of incident photons on the corresponding pixel. One obvious solution for improving the sensitivity could have consisted of reducing the volume occupied by the via or the doped zone, at the centre of the pixel. Although this solution appears simpler, it is found to be technologically more difficult to implement.

Preferably, the base of the first truncated pyramid is a square or a rectangle.

Each of the first and second pyramids is advantageously a straight pyramid.

Preferably, a height h of each of said refractive structures satisfies the following relation:

$$h \geq \frac{\lambda_{moy}}{2n_1} \quad [\text{Math 2}]$$

in which $n_1$ is the optical index of said refractive structures and $\lambda_{mean}$ is the central wavelength of a spectral detection range of the photodetection device.

Each of the angles at the base of each of said first pyramids and second pyramids is advantageously between 50° and 60°.

The optical index of said refractive structures is preferably less than or equal to 1.7.

In each refractive structure, the lateral faces of the second pyramid are advantageously parallel in pairs to the lateral faces of the first pyramid.

In each refractive structure, the first pyramid is truncated, preferably in a plane parallel to the plane of the pixel matrix.

In each refractive structure, the recess is advantageously in the shape of a second complete pyramid that extends to the base of the first truncated pyramid.

Advantageously, in each refractive structure, the lateral faces of the first truncated pyramid and the lateral faces of the recess join together in pairs on the side opposite the photodiodes.

As a variant, in at least one of the refractive structures, the lateral faces of the first truncated pyramid and the lateral faces of the recess can be separated in pairs by an upper surface of the refractive structure, on the side opposite the photodiodes.

According to a first embodiment, each refractive structure extends over a single pixel.

In this first embodiment and advantageously, in at least one of the refractive structures, the lateral faces of the first truncated pyramid and the lateral faces of the recess are separated in pairs by an upper surface of the refractive structure located on the side opposite the photodiodes, and each point on said upper surface is spaced at a distance from the lower face of the refractive structure equal to $d_1(x, y)$ greater than or equal to $d_{1\_lim}$, and also approximately equal to $d_{1\_lim}$, within plus and minus 10%, in which:

$$d_{1\_lim} = \frac{P}{4} * \frac{\tan(\varphi_1)}{1 + \tan(\varphi_j) * \tan(\varphi_j - \theta)} \quad [\text{Math 3}]$$

in which P is a pixel pitch of the pixel matrix;
$\varphi_j$ is an angle at the base of said first pyramid; and
$\theta$ is the angle of refraction, in the refractive structure, of light radiation arriving on the pixel matrix at normal incidence.

According to a second embodiment, each refractive structure extends overlapping over several neighbouring pixels.

In the second embodiment, and advantageously, in at least one of the refractive structures, the lateral faces of the first truncated pyramid and the lateral faces of the recess are separated in pairs by an upper surface of the refractive structure located on the side opposite the photodiodes, and each point on said upper surface is spaced at a distance from the lower face of the refractive structure equal to $d_2(x, y)$ less than:

$$\frac{P}{4} * \frac{\tan(\varphi_j)}{1 + \tan(\varphi_j) * \tan(\varphi_j - \theta)} \quad [\text{Math 4}]$$

in which P is a pixel pitch of the pixel matrix;
$\varphi_j$ is an angle at the base of said first pyramid; and
$\theta$ is the angle of refraction, in the refractive structure, of light radiation arriving on the pixel at normal incidence.

The device according to the invention may comprise an antireflection layer between the refractive structures and the photodiodes.

The invention also relates to a method of making a device according to the invention, wherein each of the angles at the base of the first pyramids and the second pyramids is between 50° and 60°, the method including the following steps:
deposit an impression layer that will cover a photodiode matrix, each of said photodiodes having their absorption region that extends entirely or mostly in a volume surrounding a central region of the pixel, and
impression of the impression layer to form the refractive structures, using a silicon mould that is pressed in contact with the impression layer.

BRIEF DESCRIPTION OF THE DRAWINGS

This invention will be better understood after reading the description of example embodiments given purely for information and that are in no way limitative, with reference to the appended drawings on which.

DETAILED PRESENTATION OF PARTICULAR EMBODIMENTS

Figure 1A:
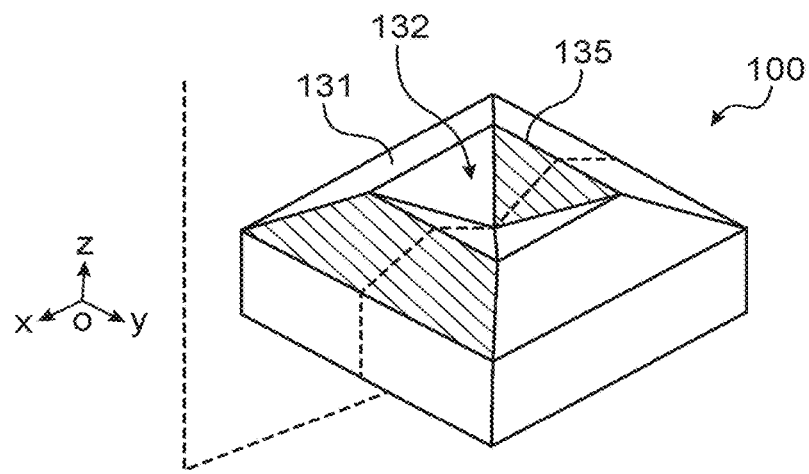
FIG. 1A and FIG. 1B are a perspective view and a sectional view respectively diagrammatically illustrating a first embodiment of a photodetection device according to the invention.
Figure 1B:
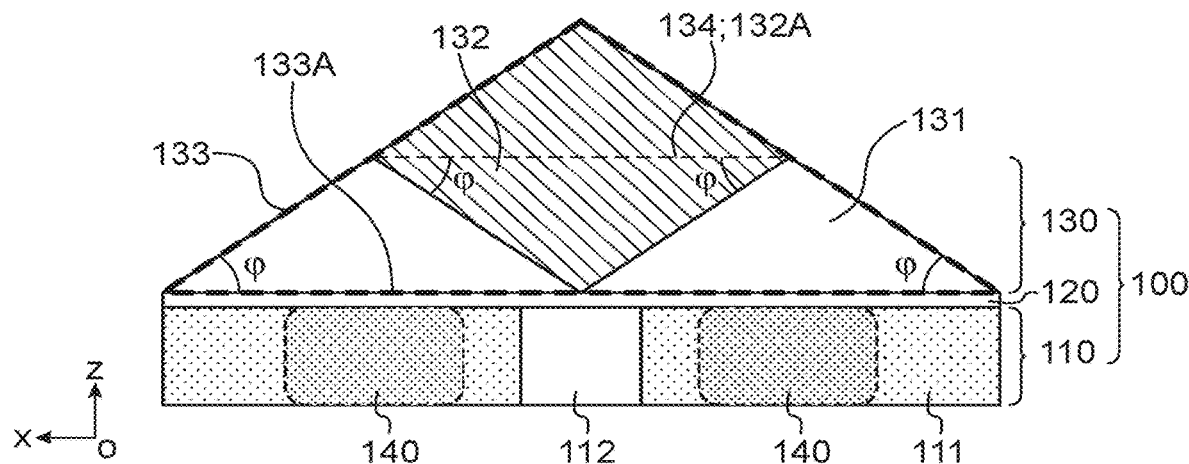

FIGS. 1A and 1B diagrammatically illustrate a photodetection device according to a first embodiment of the invention, in a perspective view and a sectional view on a plane parallel to the (xOz) plane of an orthonormal coordinate system (Oxyz), respectively.

The photodetection device according to the invention is formed from a plurality of pixels, distributed as a pixel matrix along two directions in space. The two directions in space define the (Oxy) plane of the pixel matrix. This plane is parallel to a top or bottom face of the pixel matrix. A single pixel 100 of the photodetection device is shown for reasons of clarity.

According to the invention, the photodetection device comprises the following, superposed in the order given along (Oz) axis:
a stage 110 containing photodiodes,
an optional antireflection layer 120, and
a stage 130 comprising focussing elements, to focus light radiation arriving at an approximately normal incidence on the pixel matrix, on absorption regions of the photodiodes.

In stage 110, each of the photodiodes extends in a corresponding pixel in the pixel matrix. In particular, each photodiode comprises a PN junction, and an absorption region in which incident photons generate electron-hole pairs at the origin of the emission of an electric current at the PN junction. The absorption region extends entirely or almost entirely in a volume 111 laterally surrounding a central region 112 of the pixel 100. Said central region 112 is centred on the pixel 100, and extends over the entire height of the stage 110. Such photodiodes are described in more detail in the following, with reference to FIGS. 8A and 8B.

The antireflection layer 120 protects the photodiodes, and provides a non-reflecting interface between stage 110 and stage 130. It usually has an optical index equal to between 2 and 3, for example 2.2. Its thickness is of the order of $\lambda_{mean}/4n_{ar}$, in which $\lambda_{mean}$ is the central wavelength of a range of wavelengths that the photodiodes are capable of detecting and $n_{ar}$ is the optical index of said layer. For example, this thickness may be between 1 μm and 3 μm, for example 2.2 μm. For example, it is composed of zinc sulphide. A residual substrate layer, not shown, can extend between the antireflection layer 120 and the stage 110 containing photodiodes. The thickness of the residual substrate layer is less than 5 μm.

In stage 130, each of the focussing elements extends in a corresponding pixel in the pixel matrix. The focussing elements extend on the side of the pixel matrix that receives radiation to be detected. In each pixel, the focussing element is capable of focussing light radiation arriving at the photodetection device along an axis approximately normal to the plane of the pixel matrix, in the absorption region of the photodiode. Therefore each focussing element is capable of focussing said light radiation in the volume 11 of said pixel. The assembly of focussing elements is composed of refractive structures 131.

In this case, each pixel comprises a corresponding refractive structure 131. In each pixel, the refractive structure 131 and the photodiode are centred on the pixel.

Each refractive structure 131 extends in a volume delimited by the walls of a first truncated pyramid, and provided with a recess 132 that extends to the base of said first pyramid.

FIG. 1B is a sectional view of the pixel 100, in an (xOz) plane passing through the centre of the pixel 100. In particular, FIG. 1B shows the refractive structure 131 of the pixel 100, and the first pyramid 133 and the truncation surface 134 defining the first truncated pyramid.

The base 133A of the first pyramid 133 extends on the side of the stage 110 containing photodiodes, parallel to the (Oxy) plane of the photodiode matrix. The shape of the base 133A may be square or rectangular, depending on whether the pixels of the photodiode matrix are distributed in a square or rectangular mesh. The sides of the base are oriented to be parallel to the (Ox) axis, or parallel to the (Oy) axis. The first pyramid 133 is a straight pyramid, which means that a line connecting the centre of the base and the apex is orthogonal to said base.

The truncation surface 134 extends at a distance from the base 133A, without passing through the base. In this case, the truncation surface 134 extends in a plane parallel to the plane of the pixel matrix.

The recess 132 is in the form of a complete or a truncated pyramid. In the example in FIGS. 1A and 1B, it is a second complete pyramid, therefore the recess 132 is pointed at the bottom. The base 132A of the second pyramid 133 extends parallel to the (Oxy) plane of the photodiode matrix. This base 132A extends on the side of the refractive structure opposite the stage 110 containing photodiodes. The second pyramid thus forms an inverted pyramid.

The shape of the base 132A of the second pyramid may be square or rectangular. The sides of the base 132A are parallel in pairs to the sides of the base 133A. In other words, each side of the base 132A is parallel to a corresponding side of the base 133A. The second pyramid is also an inverted pyramid.

The lateral faces of the first truncated pyramid and the lateral faces of the pyramid-shaped recess join together in pairs forming edges, on the side opposite the stage 110 containing photodiodes.

In the example shown in FIGS. 1A and 1B, the lateral faces of the second pyramid are parallel in pairs to the corresponding lateral faces of the first pyramid. In other words, each lateral face of the second pyramid is parallel to a corresponding lateral face of the first pyramid. On FIG. 1A, a pair composed of a lateral face of the first pyramid and a lateral face of the second pyramid parallel to each other is shown cross-hatched. It can be seen that the lateral faces parallel in pairs are not directly facing each other. The lateral faces of a pyramid are its triangular faces, distinct from the base. The second pyramid then corresponds to the complementary shape of the first truncated pyramid, forming a complete pyramid with this truncated pyramid.

In this case, the first pyramid 133 is truncated at mid-height. As seen in a sectional view, the refractive structure 131 is then in the form of two isosceles triangles (see FIG. 1B).

Angles at the base of the first pyramid are formed between the base 133A of said first pyramid and a lateral face of the same first pyramid, respectively. In this case, all angles at the base of the first pyramid are equal to the same value $\varphi$, because the first pyramid is a straight pyramid.

Similarly, angles at the base of the second pyramid are formed between the base 132A of said second pyramid, and a lateral face of the same first pyramid, respectively. In this case, the lateral faces of the first and second pyramids are parallel in pairs, such that the angles at the base of the first pyramid and the angles at the base of the second pyramid are equal in pairs. Therefore each of the angles at the base of the second pyramid is equal to this same value $\varphi$.

Figure 2:
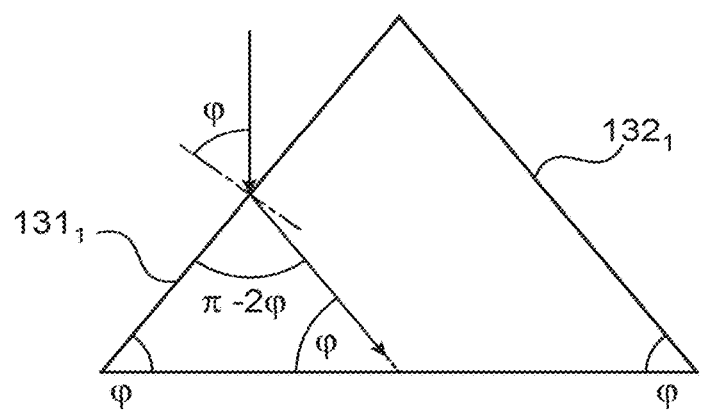
FIG. 2 diagrammatically illustrates an upper limit of an angle at the base of the refractive structure of a photodetection device according to the invention.

The value $\varphi$ is such that light radiation arriving at normal incidence on the pixel matrix on the side opposite the photodiodes, passes through the refractive structure 131 without being reflected inside this refractive structure. We refer to a nominal condition, as opposed to a resonant condition in which said light radiation is reflected once or several times inside the refractive structure. The nominal condition is obtained for values of $\varphi$ less than an upper limiting value $\varphi$ max. The upper limiting value $\varphi$ max is the value of $\varphi$ for which said light radiation arriving at the refractive structure at a first lateral face 1311, is refracted in the refractive structure parallel to a second lateral face 1321. The first lateral face 1311 belongs to the first truncated pyramid. The second lateral face 1321 belongs to the recess 132. This situation is illustrated on FIG. 2, that represents part of the refractive structure 131 in a sectional view on a plane parallel to the (xOz) plane. It can be seen on FIG. 2 that this situation corresponds to the case in which:

[Math 5]

$$\pi - 2\varphi_{max} + \theta = \frac{\pi}{2} \qquad (2)$$

in which $\theta$ is the refraction angle of said light radiation in the refractive structure 131.

According to Snell-Descartes' law, we obtain:
[Math 6]

$$n_0 \sin(\theta) = n_1 \sin(\varphi_{max}) \qquad (3)$$

in which $n_0$ is the optical index of a surrounding medium around the refractive structures on the side opposite to stage 110 containing the photodiodes, and $n_1$ is an optical index of said refractive structures.

Consequently, equation (2) results in:

[Math 7]

$$2\varphi_{max} - \sin^{-1}\left(\frac{n_0}{n_1}\sin(\varphi_{max})\right) = \frac{\pi}{2} \qquad (4)$$

Thus, to obtain operation under nominal conditions, the value $\varphi$ satisfies:

[Math 8]

$$2\varphi - \theta = 2\varphi - \sin^{-1}\left(\frac{n_0}{n_1}\sin(\varphi)\right) < \frac{\pi}{2} \qquad (5)$$

$n_0$ is preferably the optical index of air, approximately equal to one.

$n_1$ is advantageously between 1.2 and 3.5, and preferably between 1.3 and 1.7, for example equal to 1.4 or 1.6. To achieve this, the refractive structures are for example made of resin, polydimethylsiloxane (PDMS), zinc sulphide (ZnS), silicon dioxide, silicon, silicon nitride, or another material transparent to the wavelengths to be detected (preferably a dielectric).

In the nominal condition, after passing through the refractive structures, rays arriving at an approximately normal incidence on the pixel matrix are concentrated in an interference zone 140 located in the stage 110 containing photodiodes.

The interference zone 140 extends in a volume laterally surrounding a central region of the pixel, facing an intersection line 135 between the first pyramid and the second pyramid associated with said refractive structure. The intersection line 135 extends on the side of the refractive structure opposite the stage 110 containing the photodiodes. In the embodiment shown in FIGS. 1A and 1B, the lateral faces of the first truncated pyramid and the lateral faces of the recess join together in pairs at this intersection line 135. In the embodiments described below, the intersection line 135 is a virtual line located at a distance from the refractive structure 131, the lateral faces of the first truncated pyramid and the recess not being in contact on the side opposite the photodiodes. In any case, the intersection line 135 preferably follows a path centred on the pixel with a shape homothetic to the contours of the pixel (in this case with a square or rectangular shape).

The light energy of rays arriving on the pixel 100 is concentrated in the interference zone 140, with a maximum amplitude located exactly facing the intersection line 135. It can be shown that in the nominal condition, this maximum is always present. This special feature is lost under resonant conditions. In some cases, there may be second order maxima on each side of the maximum.

In each pixel 100, the interference zone 140 extends within the volume 111, without going into the central region 112 of said pixel. Therefore, light rays arriving at an approximately normal incidence on the pixel are concentrated in the absorption zone of said pixel, where they can form charge carriers capable of generating a current in the photodiode. In particular, even when these rays arrive at the pixel facing its central region 112, they are deviated towards the periphery of the pixel and reach the absorption zone. Thus, a photodetection device is made with improved capture efficiency and therefore improved sensitivity.

In one advantageous variant, the pixels in the pixel matrix are distributed in a square mesh, and with a distribution pitch P. The maximum amplitude of the energy in the interference zone 140 then extends along a square path with side dimension P/2, centred on the pixel. The maxima in a sectional view in a plane parallel to the (Oxz) plane are then located on the P/4 and 3P/4 abscissas, along the (Ox) axis.

Advantageously, the height h of the refractive structures 131 is sufficient so that they can be "seen" by the light radiation to be detected. To achieve this, the height h satisfies the relation:

[Math 9]

$$h \geq \frac{\lambda_{moy}}{2n_1} \quad (6)$$

in which $n_1$ is the optical index of the refractive structures and $\lambda_{mean}$ is the central wavelength of a range of wavelengths that the photodiodes can detect.

The height h is defined along the (Oz) axis orthogonal to the plane of the pixel matrix. For refractive structures with an index $n_1=1.4$, this height is more than 4 μm, or even more than 5 μm.

In the embodiment illustrated in FIGS. 1A and 1B, and when the pixels are distributed in a square mesh with a distribution pitch P, equation (6) results in a condition on the value φ of the angle at the base of the first pyramid. This value φ must be greater than a lower limiting value $\varphi_{min}$ that satisfies the relation:

[Math 10]

$$\varphi_{min} = \arctan\left(\frac{2\lambda_{moy}}{n_1 P}\right) \quad (7)$$

The value φ must then be between the lower limiting value $\varphi_{min}$, defined in equation (7), and the upper limiting value $\varphi_{max}$ defined in equation (4). In practice, and for an optical index of the refractive structures approximately equal to 1.4, the value φ is advantageously between 50° and 65°, or even between 50° and 60°.

Figure 3:
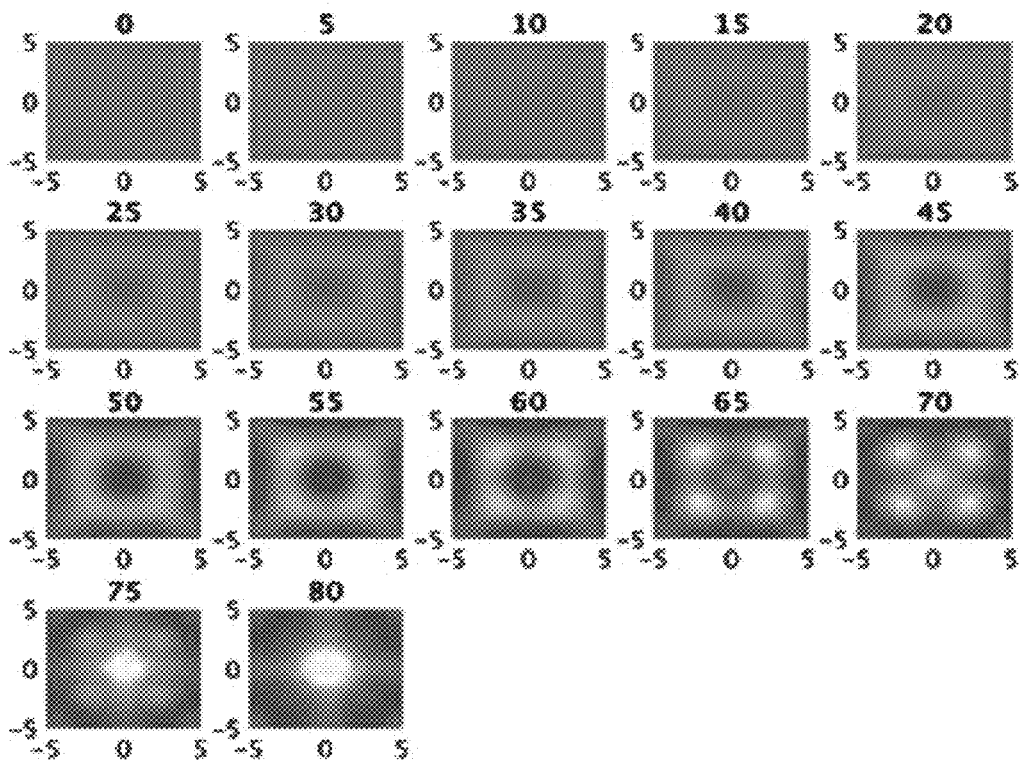
FIG. 3 illustrates a distribution of the electromagnetic field under the refractive structure of a photodetection device according to the first embodiment of the invention, as a function of the value of an angle at the base of said structure.

FIG. 3 contains an illustration of the distribution of the electromagnetic field under the refractive structure of the photodetection device in FIGS. 1A and 1B, for different values of the value φ of the angle at the base of the first pyramid, and for an optical index of the refractive structures equal to approximately 1.4. In this case, the pixels in the pixel matrix are distributed in a square mesh, with a distribution pitch P=10 μm. On each distribution figure, the abscissa axis is a distance along the (Ox) axis, in μm, the ordinate axis is a distance along the (Oy) axis, in μm. The value φ expressed in degrees is noted above each distribution figure. The electromagnetic field originates from light radiation arriving at an approximately normal incidence on the pixel matrix, on the side opposite the photodiodes. Lighter colours correspond to a higher intensity of the electromagnetic field.

It can be seen that for φ equal to between 50° and 65° and for an optical index of the refractive structures equal to approximately 1.4, most of the electromagnetic field is concentrated in a region open at the centre, centred on the pixel. At below 50°, the distribution of the field in the pixel remains relatively uniform. At above 65°, a maximum intensity appears at the centre of the pixel, which is the contrary to the required effect (resonant condition).

It can also be shown that low index refractive structures, in other words with an optical index $n_1$ close to 1.4, are particularly advantageous. "Close to 1.4" means between 1.2 and 1.7, and preferably between 1.35 and 1.45. These low index values are such that the optical transmission at the interface between the surrounding air and the refractive structures is close to one for angles at the base φ equal to between 50° and 65° (light rays arriving on the pixel matrix at normal incidence are then oriented approximately at the Brewster angle relative to the lateral faces of the refractive structure). If applicable, when their optical index is more than 1.4, the refractive structures can be covered with a conforming antireflection layer on the side opposite the photodiodes. In any case, values of the optical index $n_1$ that are too high can prevent the existence of a value of φ between the lower limiting value $\varphi_{min}$ and the upper limiting value $\varphi_{max}$.

Figure 4:
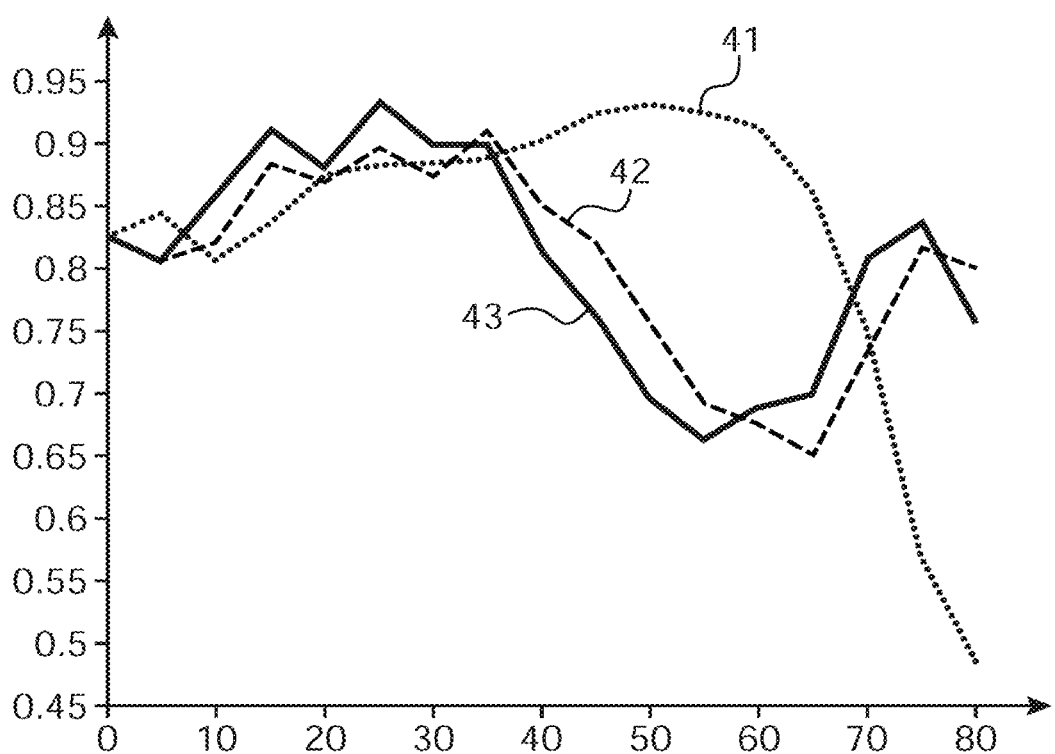
FIG. 4 illustrates curves of absorption in a pixel of a photodetection device according to the first embodiment of the invention, as a function of the value of an angle at the base of the corresponding refractive structure, for different values of the optical index of said structure.

FIG. 4 contains an illustration of curves of absorption by a pixel of the photodetection device in FIGS. 1A and 1B as a function of the value φ taken on by the angle at the base of the first pyramid, and for different values of the optical index of the refractive structure. In this case, pixels in the pixels matrix are distributed in a square mesh and with a distribution pitch P=10 μm. The central region comprises a through opening, or via, with a diameter of 4 μm.

The abscissa axis is the value of the angle φ, in degrees. The ordinate axis is an absorption ratio. Curves 41, 42, 43 correspond to a value $n_1=1.4$, $n_1=2.7$, $n_1=3.4$ respectively of the optical index of the refractive structure.

The absorption ratio at φ=0° corresponds to the absorption ratio when there is no refractive structure. In this case, this ratio is 0.82. It can be seen that the index $n_1=1.4$ gives the highest values of the absorption ratio, and the widest operating range (range of values of φ providing an absorption ratio higher than a predetermined threshold).

Figure 5A:
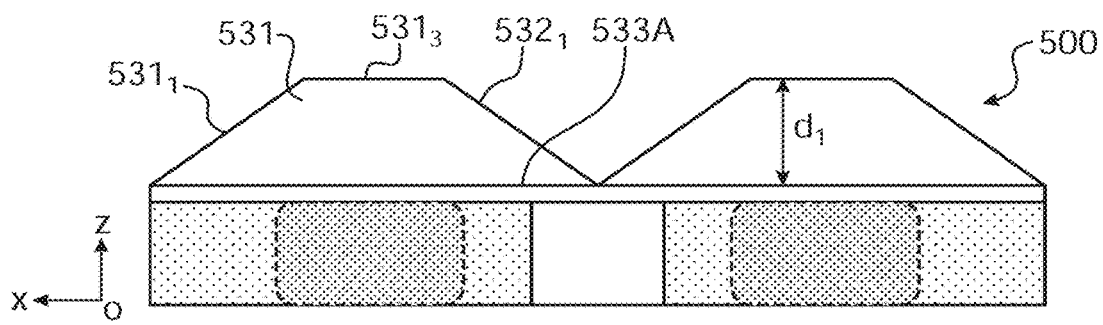
FIG. 5A and FIG. 5B diagrammatically illustrate a second embodiment of a photodetection device according to the invention.
Figures 5B, 6B:
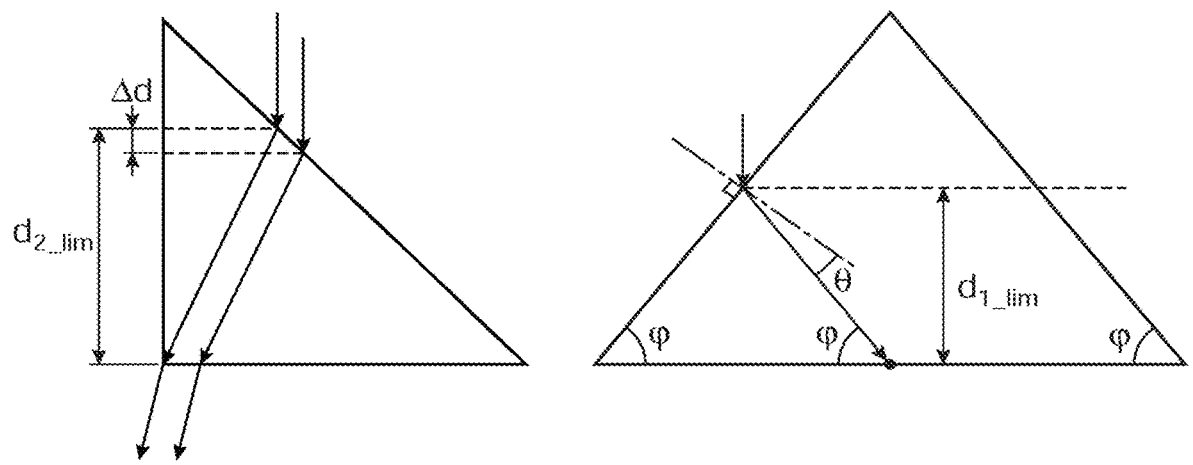
FIG. 6A and FIG. 6B diagrammatically illustrate a third embodiment of a photodetection device according to the invention.

FIGS. 5A and 5B illustrate a second embodiment of a photodetection device according to the invention, for which only the differences from the embodiment in FIGS. 1A and 1B will be described.

As described in detail above, the refractive structure concentrates energy in the stage containing photodiodes, with maximum energy located approximately facing the intersection line between the first pyramid and the second pyramid associated with said refractive structure. The second embodiment is based on the idea that not all light rays arriving on the pixel contribute to this maximum energy. In particular, the refractive structure can be clipped, while keeping the same energy distribution in the stage containing the photodiodes. In particular, the refractive structure can be truncated to the level of a first limiting plane located at a distance $d_{1\_lim}$, from the lower face of the refractive structure, while keeping the same energy distribution in the stage containing the photodiodes. The first limiting plane extends parallel to the (Oxy) plane of the pixel matrix. The lower face of the refractive structure is formed by the base of the first pyramid associated with said refractive structure. The distance $d_{1\_lim}$, is measured along an (Oz) axis orthogonal to the plane of the pixels matrix. It can be demonstrated that $d_{1\_lim}$ satisfies:

[Math 11]

$$d_{1\_lim} = \frac{P}{4} \frac{\tan(\varphi)}{(1 + \tan(\varphi)\tan(\varphi - \theta))} \quad (8)$$

in which P is the distribution pitch of pixels in the pixels matrix, $\varphi_j$ is the value of the angle at the base of the first pyramid, and θ is the angle of refraction in the refractive structure of light radiation arriving on the pixels matrix at normal incidence. The angle θ satisfies the condition of equation (3).

When the pixels are distributed in a rectangular mesh, P is the smaller of the two distribution pitches and φ is the angle at the base along the axis of this smaller pitch.

FIG. 5B represents part of the refractive structure, in a sectional view on a plane parallel to the (xOz) plane. In particular, FIG. 5B illustrates the distance $d_{1\_lim}$, and construction lines used to arrive at equation (8).

Figure 5A illustrates a pixel 500 of a photodetection device according to the second embodiment, in a sectional view in a plane parallel to the (Oxz) plane. In each pixel 500, the lateral faces 531₁ of the first truncated pyramid and the lateral faces 532₁ of the recess in the form of a second inverted pyramid are not in contact in pairs on the side opposite the photodiodes. They are separated by an upper surface 531₃ of the refractive structure 531. Said upper surface 531₃ extends on the side of the refractive structure opposite the photodiodes, with an open shape at the centre. In this case, said upper surface 531₃ is a plane surface located at distance $d_1$ from the lower face 533A of the refractive structure in which $d_1$ is greater than $d_{1\_lim}$ and is approximately equal to $d_{1\_lim}$ within plus or minus 20%, or even plus or minus 10%.

In one variant not shown, the upper surface 531₃ is a non-plane surface. In this case, each point with coordinates (x, y) forming part of said upper surface 531₃ is located at a distance $d_1(x, y)$ from the lower face 533A of the refractive structure. The distance $d_1(x, y)$ satisfies the relation:

[Math 12]

$$d_1(x,y) \geq d_{1\_lim}, \forall x, \forall y \qquad (9)$$

Preferably, $d_1(x, y)$ is also approximately equal to $d_{1\_lim}$ for all values of x and for all values of y, within plus or minus 20%, or even plus or minus 10%.

The same pixel matrix may comprise complete refractive structures as in FIGS. 1A and 1B and truncated refractive structures as shown in FIG. 5A, with different truncation planes from one pixel to the next. As long as equation (9) is satisfied for all pixels, this will not cause any significant difference in efficiency from one pixel to another in the pixel matrix. This special feature enables considerable flexibility in fabrication. In particular, differences between pixels can be tolerated, related to varying sizes of portions of material remaining in the bottom of an impression mould during the step to fabricate the refractive structures.

Figure 6A:
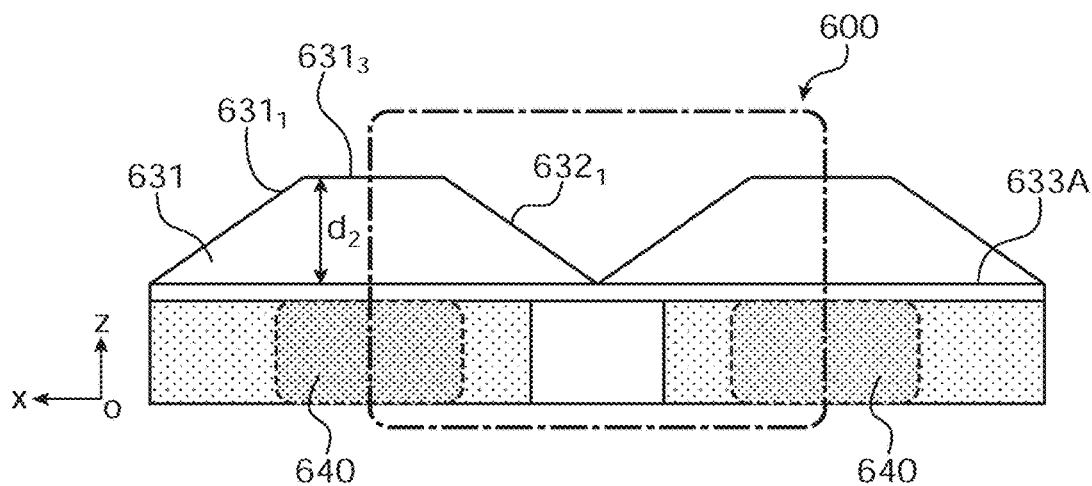

FIGS. 6A and 6B illustrate a third embodiment of a photodetection device according to the invention, for which only the differences from the embodiment in FIGS. 1A and 1B will be described.

FIG. 6A illustrates a pixel 600 of a photodetection device according to this third embodiment, in a sectional view in a plane parallel to the (Oxz) plane. Pixel 600 is surrounded by chain dotted lines. FIG. 6A also shows portions of adjacent pixels. According to this manufacturing method, each refractive structure 631 extends over several pixels, and the corresponding interference zones 640 extend overlapping on adjacent pixels. The focussing element of each pixel is then composed of only a portion of at least one refractive structure.

In each refractive structure, the lateral faces 631₁ of the first truncated pyramid and the lateral faces 632₁ of the recess are not in contact in pairs on the side opposite the photodiodes. They are separated by an upper surface 631₃ of the refractive structure 631. The planes of the lateral faces 631₁ of the first truncated pyramid and the lateral faces 632₁ of the recess join together on the side opposite the photodiodes, along an intersection line facing the boundaries between adjacent pixels.

For the same reasons as described above, the refractive structure can be clipped, while keeping the same energy distribution characteristics in the stage containing the photodiodes. In particular, the refractive structure can be truncated to the level of a second limiting plane located at a distance $d_{2\_lim}$ from the lower face of the refractive structure, while keeping the same energy distribution in the stage containing the photodiodes. The second limiting plane extends parallel to the (Oxy) plane of the pixel matrix. The distance $d_{2\_lim}$ is measured along an (Oz) axis orthogonal to the plane of the pixel matrix. It can be demonstrated that $d_{2\_lim}$ satisfies:

[Math 13]

$$d_{2\_lim} = \frac{P}{2} \frac{\tan(\varphi)}{(1 + \tan(\varphi)\tan(\varphi - \theta))} \qquad (10)$$

in which P is the distribution pitch of pixels in the pixel matrix, $\varphi_j$ is the value of the angle at the base of the first pyramid, and θ is the angle of refraction in the refractive structure of light radiation arriving on the pixel matrix at normal incidence (θ satisfies the condition in equation (3)).

When the pixels are distributed in a rectangular mesh, P is the smaller of the two distribution pitches and φ is the angle at the base along the axis of this smaller pitch.

According to the third embodiment, the refractive structure is clipped slightly below the second limiting plane, so as to space energy maxima relative to the boundaries between two adjacent pixels. This thus limits cross-talk between adjacent pixels.

In FIG. 6A, the refractive surface is clipped on a plane face 631₃, at a distance $d_2$ from the lower face 633A of the refractive stricture in which $d_2$ is less than $d_{2\_lim}$. For example, the difference between $d_2$ and $d_{2\_lim}$ is between 0.8 μm and 1.2 μm. For example, it is equal to 1 μm.

FIG. 6B represents part of the refractive structure 631 in a sectional view on a plane parallel to the (xOz) plane. The distance $d_{2\_lim}$ is shown on FIG. 6B. The difference Δd between $d_2$ and $d_{2\_lim}$ is adapted to prevent a photon arriving facing a predetermined pixel from emerging from the refractive structure sufficiently close to a neighbouring pixel to be diffused as far as the absorption region of said neighbouring pixel. Preferably, Δd is adapted so that this photon emerges from the refractive structure at a distance D from the closest pixel in which $D \approx \lambda_{mean}/n_{obs}$, where $n_{obs}$ is the optical index of the absorption region and $\lambda_{mean}$ is the central wavelength of a range of wavelengths that the photodiodes are capable of detecting.

According to one variant not shown, the upper surface 631₃ is a non-planar surface. In this case, each point with coordinates (x, y) forming part of said upper surface 631₃ is located at a distance $d_2(x, y)$ from the lower face 633A of the refractive structure. The distance $d_2(x, y)$ satisfies the relation:

[Math 14]

$$d_2(x,y) < d_{2\_lim}, \forall x, \forall y \qquad (11)$$

Preferably, $d_2(x, y)$ is also approximately equal to $\{d_{2\_lim} - 1$ μm$\}$ for all values of x and for all values of y, within plus or minus 10%, or even plus or minus 5%.

This embodiment is advantageous when the photodiodes are distributed with a small pixel pitch, for example less than or equal to 7.5 µm. It is even more advantageous in combination with photodiodes each of which is provided with a central via with a diameter greater than or equal to half of the pixel pitch. For example, there may be a pitch of 7.5 µm and vias in the form of a cylinder of revolution with diameter 5 µm.

Figure 7:
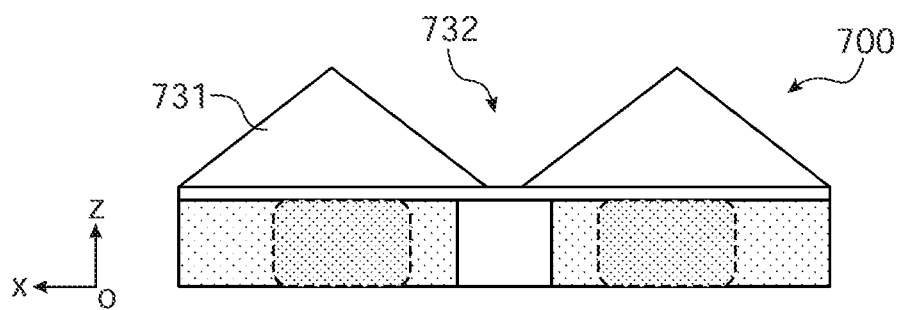
FIG. 7 diagrammatically illustrates a fourth embodiment of an photodetection device according to the invention.

FIG. 7 diagrammatically illustrates a pixel 700 of a fourth embodiment of a photodetection device according to the invention, for which only the differences from the embodiment in FIGS. 1A and 1B will be described. In this embodiment, the shape of the refractive structure 731 is defined by a first truncated pyramid, provided with a recess 732 in the form of a second truncated pyramid. The bottom of the recess 132 is plane, on the side of the stage comprising the photodiodes. A section through the refractive structure 731, in a plane parallel to the (Oxz) plane, is then in the form of two triangles separated by a free space between the two.

Figure 8A:
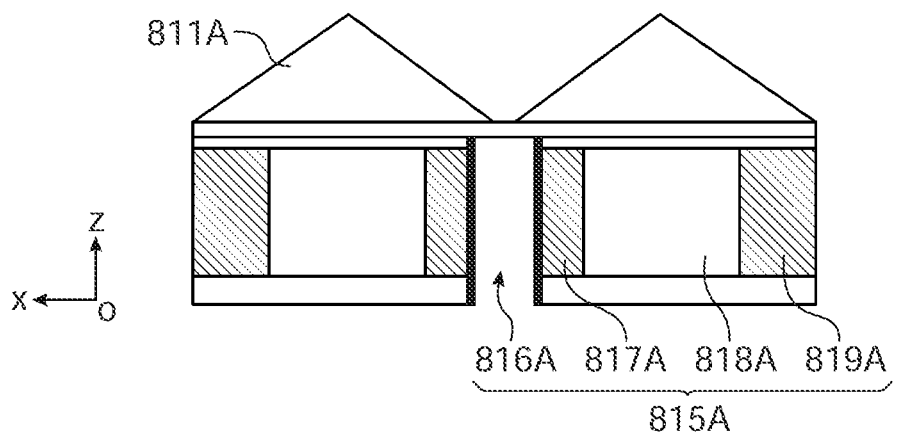
FIG. 8A and FIG. 8B illustrate sectional and detailed views respectively of two variants of the first embodiment of a photodetection device according to the invention.
Figure 8B:
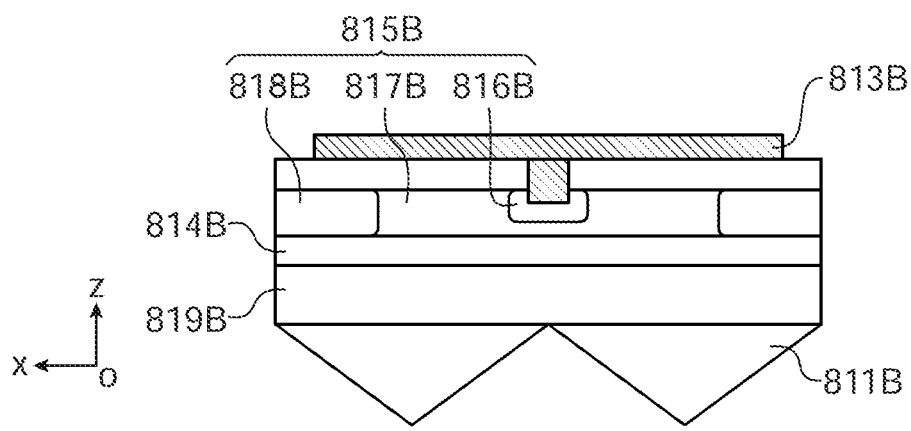

FIGS. 8A and 8B illustrate sectional and detailed views of two variants of the first embodiment of a photodetection detection according to the invention.

In FIG. 8A, each of the photodiodes 815A comprises a through opening 816A, or via, centred on the corresponding pixel. In this case, the via 816A is surrounded by a strongly N-doped region 817A, itself surrounded by a weakly N-doped region 818A (optional), itself surrounded by a P-doped region 819A. The absorption region extends in the P-doped region 819A. In this case, the absorption region extends entirely in a volume laterally surrounding a central region of the pixel. For example, the diameter of the via 816A is 5 µm, for a pixel pitch of 15 µm. It is difficult to make vias with a diameter smaller than 4 µm, such that the via occupies a very large volume in the pixel for pixel pitches less than or equal to 10 µm.

According to this embodiment, the face on which the refractive structures 811A are supported is the front face of the photodiode matrix on the side opposite a substrate on which the photodiodes are supported. A method of fabricating the refractive structures then comprises the following steps:
 planarisation of the photodiode matrix, to cover the photodiodes and their vias with a thin plane layer;
 deposition of a thick layer of flexible material such as a resin, polydimethylsiloxane (PDMS), silicon dioxide, etc., on said thin plane layer: and
 impression of said thick layer, using a mould pressed in contact with the thick layer.
The thick layer is called the impression layer. The mould is preferably a silicon mould. Its shape is complementary to the shape required for the refractive structures.

In FIG. 8B, each of the photodiodes 815B comprises a P-doped zone 816B centred on the pixel, surrounded by an N-doped absorption region 817B, itself surrounded by a strongly N-doped separation region 818B. The photodiodes 815B extend above a substrate 819B and a confinement layer 814B. A connector 813B entering into the P-doped zone 816B is also shown. The absorption region extends mostly in a volume laterally surrounding a central region of the pixel, in this case surrounding the P-doped zone 816B. However, a thin layer of material under the P-doped caisson zone 816B also belongs to said absorption region.

According to this embodiment, the face that receives the refractive structures 811B is the back face of the photodiode matrix, on the side of the substrate 819B. Therefore the refractive structures can be formed directly in this substrate, for example by direct nano-machining by focussed electron beam. Preferably, the substrate is thinned before the refractive structures are made. As a variant, the substrate is removed (for example chemically), and an impression layer is then deposited that is then structured by direct nano-machining by focussed electron beam, or by impression as described above.

It is known that a silicon layer can be etched by wet etching through an etching mask 91, for example using a solution of KOH (potassium hydroxide). Silicon crystallography then imposes an angle α equal to about 54° between a face of the silicon layer on which the etching mask is placed and a lateral face of a recess etched in said layer. Therefore it is particularly advantageous to make refractive structures according to the invention by impression using a silicon mould, the value of 54° being located within a preferred interval of angles defining the shape of refractive structures according to the invention, when the optical index of these refractive structures is close to 1.4.

Figure 9:
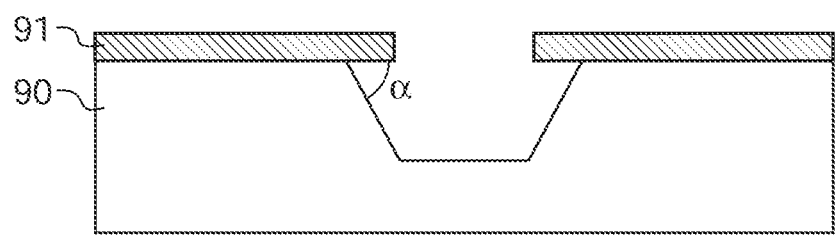
FIG. 9 illustrates a method of fabricating a mould used to make a photodetection device according to the invention.

FIG. 9 diagrammatically illustrates a detail of a silicon mould 90 that can be used to make refractive structures according to the invention, covered by its etching mask 91 (the etching mask is removed before the mould is used to form refractive structures). An expert in the subject will find it easy to size the mask 91 and to fix etching times so as to obtain the required shape of refractive structures.

The invention is not limited to the examples described above, and many variants can be implemented without going outside the framework of the invention, for example by combining different embodiments, or with refractive structures with a shape defined by non-straight pyramids, or with refractive structures with a shape defined by pyramids with a base that is an arbitrary polygonal shape, or with refractive structures with a shape defined by pyramids for which the lateral faces are not parallel in pairs, or with refractive structures for which the shape is defined by pyramids for which the angles at the base are equal to distinct different values.

The invention preferably covers a photodetection device adapted to detection in the infrared. However, the invention is not limited to this range of wavelengths and in particular can cover photodetection devices in the visible range. Preferably, the pixel pitch is approximately equal to the wavelength to be detected.

The invention is particularly advantageous when the central region in each pixel receives a via with a diameter larger than or equal to half the pixel pitch.

The invention is also particularly advantageous when the shape of the refractive structures is defined by a first pyramid with an angle at the base equal to between 53° and 56°. These values facilitate fabrication by impression using a silicon mould.

The invention claimed is:

1. A photodetection device comprising a pixel matrix having a plurality of pixels, wherein each pixel comprises a central region and a photodiode having an absorption region which extends entirely or mostly in a volume surrounding the central region, wherein:
 each pixel comprises a focussing element to focus light radiation, arriving at an approximately normal incidence on said pixel, on a corresponding absorption region;
 each focussing element is composed of an assembly of refractive structures, one of the refractive structures being formed by a first pyramid, having a truncated shape, and being provided with a recess;
 a base of said first pyramid is parallel to a plane of the pixel matrix and located on a side of the photodiode;

the recess is in the form of a second pyramid having a complete or truncated shape;

a base of the second pyramid extends parallel to the plane of the pixel matrix, on a side of the one refractive structure opposite the photodiode; and angles $\varphi_i$ between the base and a side of the first pyramid and between the base and a side of the second pyramid satisfy the following relation:

$$2*\varphi_i - \sin^{-1}\left(\frac{n_0}{n_1}\sin(\varphi_i)\right) < \frac{\pi}{2}$$

wherein:

$n_0$ is an optical index of a medium surrounding the one refractive structure on the side of the one refractive structure opposite the photodiode, $n_1$ is an optical index of said one refractive structure, and each of the refractive structures in the assembly has a same structure as that of the one refractive structure.

2. The device according to claim 1, wherein the angles $\varphi_j$ at the base of said first and second pyramids are between 50° and 60°.

3. The device according to claim 1, wherein the optical index of said one refractive structure is less than or equal to 1.7.

4. The device according to claim 1, wherein in the one refractive structure, lateral faces of the second pyramid are parallel in pairs to lateral faces of the first pyramid.

5. The device according to claim 1, wherein in the one refractive structure, the first pyramid is truncated in a plane parallel to the plane of the pixel matrix.

6. The device according to claim 1, wherein in the one refractive structure, the recess is in the form of a second complete pyramid that extends to the base of the first pyramid.

7. The device according to claim 1, wherein in the one refractive structure, lateral faces of the first pyramid and lateral faces of the recess join together in pairs on the side of the one refractive structure opposite the photodiode.

8. The device according to claim 1, wherein in the one refractive structure, lateral faces of the first pyramid and lateral faces of the recess are separated in pairs by an upper surface of the one refractive structure, on the side of the one refractive structure opposite the photodiode.

9. The device according to claim 1, wherein the one refractive structure extends over a single pixel.

10. The device according to claim 9, wherein, in the one refractive structure, lateral faces of the first pyramid and lateral faces of the recess are separated in pairs by an upper surface of the one refractive structure located on the side of the one refractive structure opposite the photodiode, and in that each point on said upper surface is spaced at a distance from a lower face of the one refractive structure equal to $d_1(x, y)$ greater than or equal to $d_{1\_lim}$, wherein:

$$d_{1\_lim} = \frac{P}{4} * \frac{\tan(\varphi_j)}{1+\tan(\varphi_j)*\tan(\varphi_j - \theta)}$$

wherein:

P is a pixel pitch of the pixel matrix;

$\varphi_j$ is an angle at the base of said first pyramid; and $\theta$ is an angle of refraction, in the one refractive structure, of light radiation arriving on the pixel matrix at normal incidence.

11. The device according to claim 1, wherein the one refractive structure extends overlapping over several neighbouring pixels.

12. The device according to claim 11, wherein, in the one refractive structure, lateral faces of the first pyramid and lateral faces of the recess are separated in pairs by an upper surface of the one refractive structure located on the side of the one refractive structure opposite the photodiode, and in that each point on said upper surface is spaced at a distance from a lower face of the one refractive structure equal to $d_2(x, y)$ which is less than:

$$\frac{P}{2} * \frac{\tan(\varphi_j)}{1+\tan(\varphi_j)*\tan(\varphi_j - \theta)}$$

P is a pixel pitch of the pixel matrix;

$\varphi_j$ is an angle at the base of said first pyramid; and $\theta$ is an angle of refraction, in the one refractive structure, of light radiation arriving on the pixel matrix at normal incidence.

13. The device according to claim 1, comprising an antireflection layer between the one refractive structure and the photodiode.

14. A method of making a device according to claim 1, wherein each of the angles $\varphi_j$ in the first and the second pyramids is between 50° and 60°, the method comprising the following steps:

depositing an impression layer that will cover the pixel matrix, the photodiode having an absorption region that extends entirely or mostly in a volume surrounding the central region of the pixel, and forming an impression in the impression layer to form the one refractive structure, using a silicon mould that is pressed in contact with the impression layer.

15. The device according to claim 1, wherein a height h of said one refractive structure satisfies the following relation:

$$h \geq \frac{\lambda_{mean}}{2n_1}$$

wherein $n_1$ is an optical index of said one refractive structure and $\lambda_{mean}$ is a central wavelength of a spectral detection range of the photodetection device.

16. The device according to claim 9, wherein, in the one refractive structure, lateral faces of the first pyramid and lateral faces of the recess are separated in pairs by an upper surface of the one refractive structure located on the side of the one refractive structure opposite the photodiode, and in that each point on said upper surface is spaced at a distance from a lower face of the one refractive structure equal to $d_1(x, y)$ greater than or equal to $d_{1\_lim}$ within plus and minus 10%, wherein:

$$d_{1\_lim} = \frac{P}{4} * \frac{\tan(\varphi_j)}{1+\tan(\varphi_j)*\tan(\varphi_j - \theta)}$$

wherein:

P is a pixel pitch of the pixel matrix;

$\varphi_j$ is an angle at the base of said first pyramid; and $\theta$ is an angle of refraction, in the one refractive structure, of light radiation arriving on the pixel matrix at normal incidence.

* * * * *